United States Patent [19]
Ventrudo et al.

[11] Patent Number: 5,589,684
[45] Date of Patent: Dec. 31, 1996

[54] MULTIPLE DIODE LASERS STABILIZED WITH A FIBER GRATING

[75] Inventors: Brian F. Ventrudo, Victoria; Peter G. Berrang, Sidney, both of Canada

[73] Assignee: SDL, Inc., San Jose, Calif.

[21] Appl. No.: 415,129

[22] Filed: Mar. 30, 1995

Related U.S. Application Data

[63] Continuation-in-part of Ser. No. 267,785, Jun. 28, 1994, Pat. No. 5,485,481.

[51] Int. Cl.$^6$ ..................................................... G02F 1/01
[52] U.S. Cl. .......................... 250/225; 372/102; 356/33
[58] Field of Search .............................. 250/225, 227.11, 250/227.17, 227.19, 227.24; 372/6, 102; 356/32–34

[56] References Cited

U.S. PATENT DOCUMENTS

| | | | |
|---|---|---|---|
| 4,635,246 | 1/1987 | Taylor et al. | 370/3 |
| 4,941,726 | 7/1990 | Russell et al. | 372/6 |
| 4,950,882 | 8/1990 | Goutzoulis et al. | 250/214 A |
| 5,015,055 | 5/1991 | Takamatsu et al. | 372/6 |
| 5,187,672 | 2/1993 | Chance et al. | 364/550 |
| 5,258,989 | 11/1993 | Raven | 372/6 |
| 5,271,024 | 12/1993 | Huber | 372/102 |
| 5,276,549 | 1/1994 | Tagawa et al. | 372/6 |
| 5,295,143 | 3/1994 | Rao et al. | 372/22 |
| 5,303,314 | 4/1994 | Duling, III et al. | 372/6 |
| 5,319,528 | 6/1994 | Raven | 362/32 |
| 5,337,382 | 8/1994 | Mizrahi | 372/102 |
| 5,373,526 | 12/1994 | Lam et al. | 372/6 |

FOREIGN PATENT DOCUMENTS

WO9413045  6/1994  WIPO.

*Primary Examiner*—Que T. Le
*Attorney, Agent, or Firm*—W. Douglas Carothers, Jr.

[57] ABSTRACT

A fibre Bragg grating is used to stabilize the intensity and frequency fluctuations of two diode lasers simultaneously. The polarized optical output from the diode lasers is collimated and directed through a beam combiner device which combines the separate beams into a single beam, thus summing the optical power. The combined beam is directed into an optical fibre containing a fibre Bragg grating which reflects a fraction of the light back into each diode laser to cause low-coherence, stable operation of each laser.

30 Claims, 3 Drawing Sheets

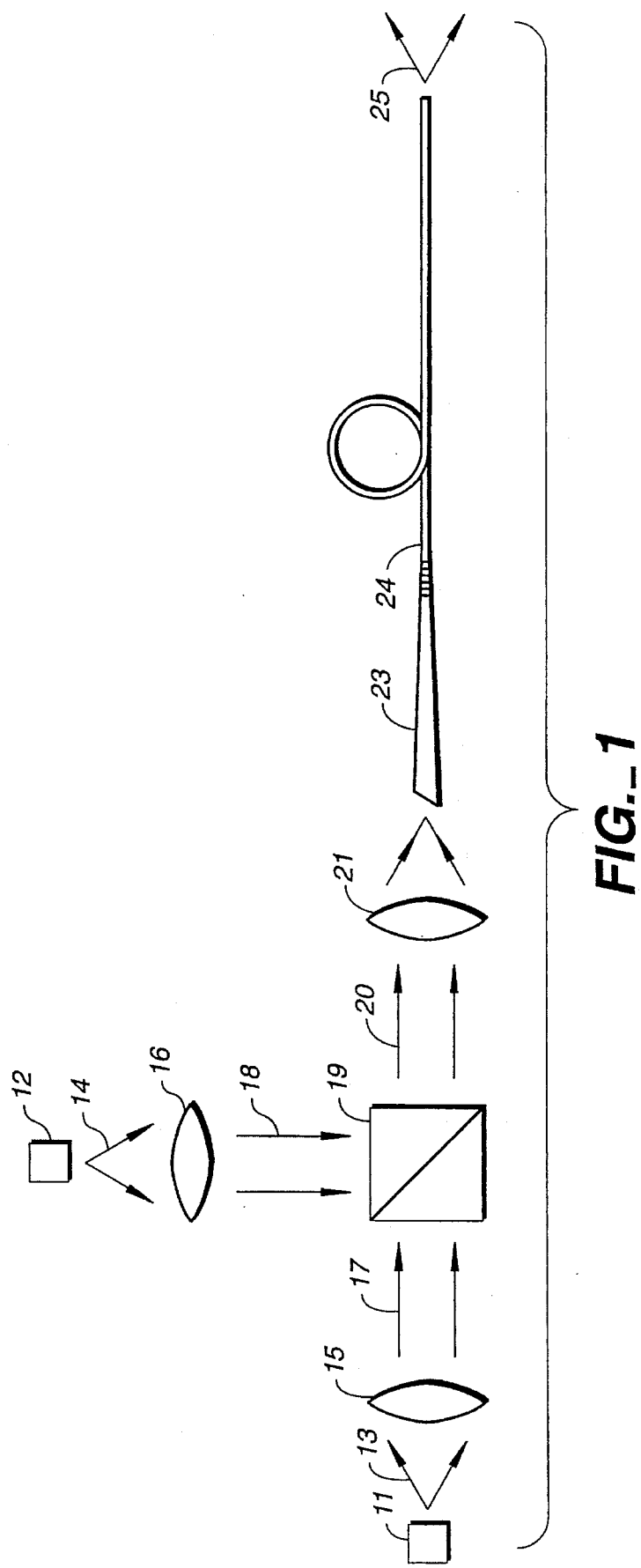
FIG._1

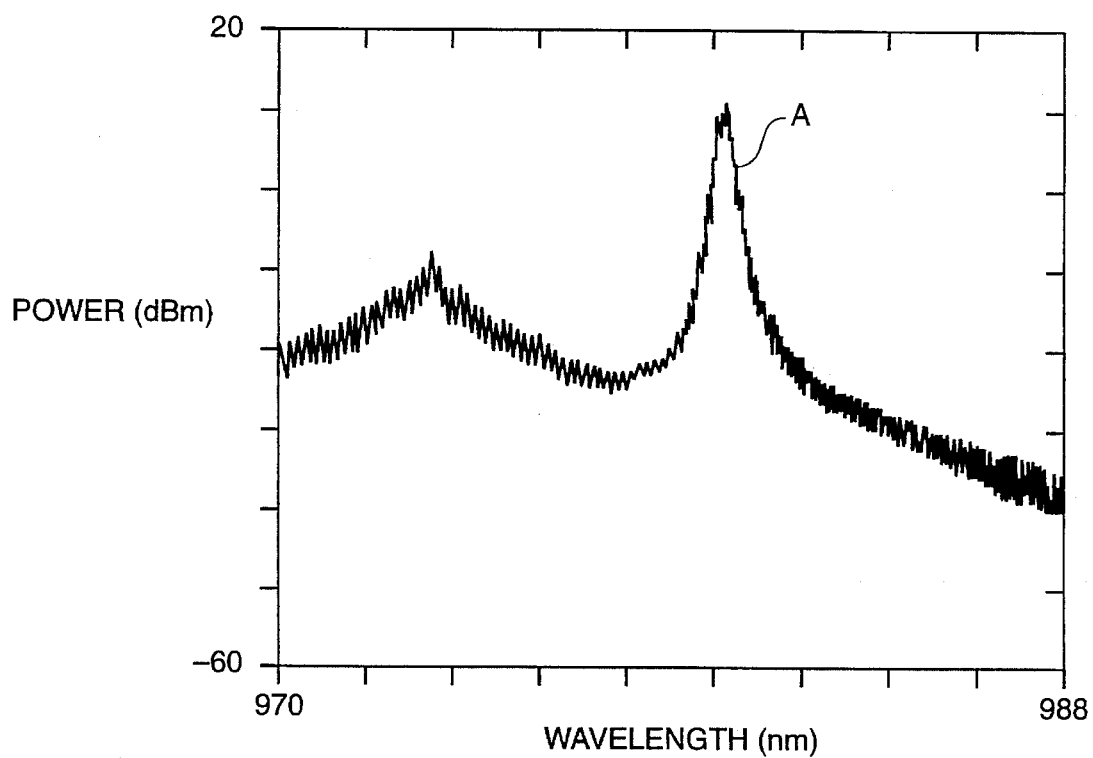
FIG._2A
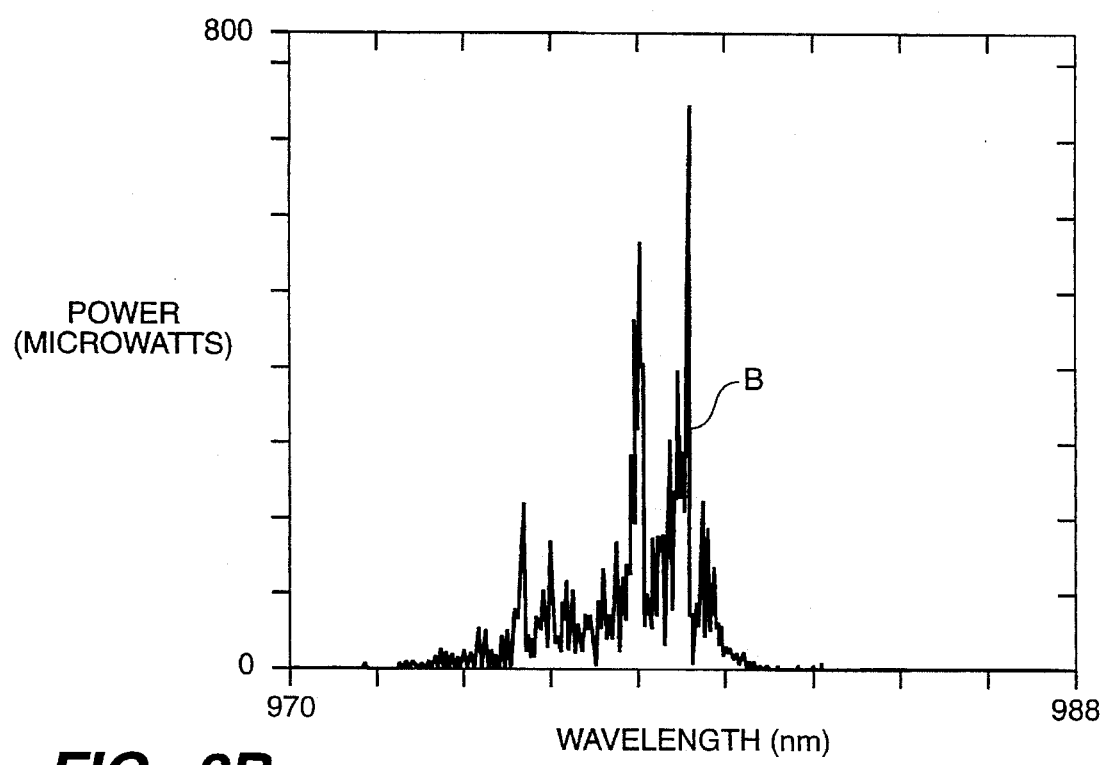
FIG._2B

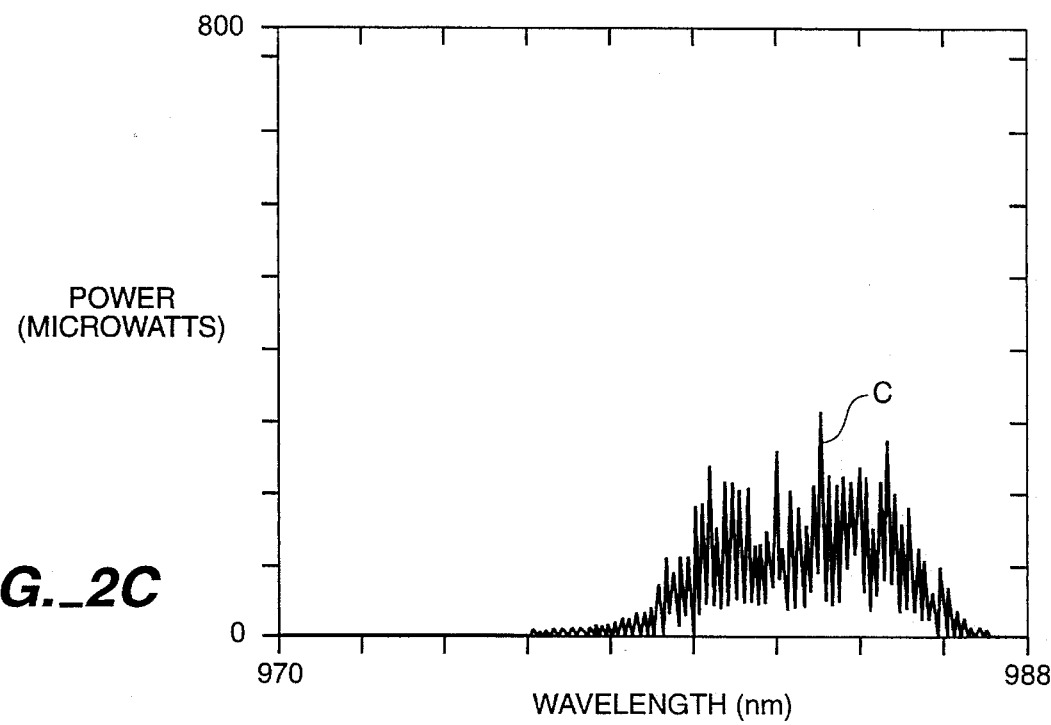
FIG._2C
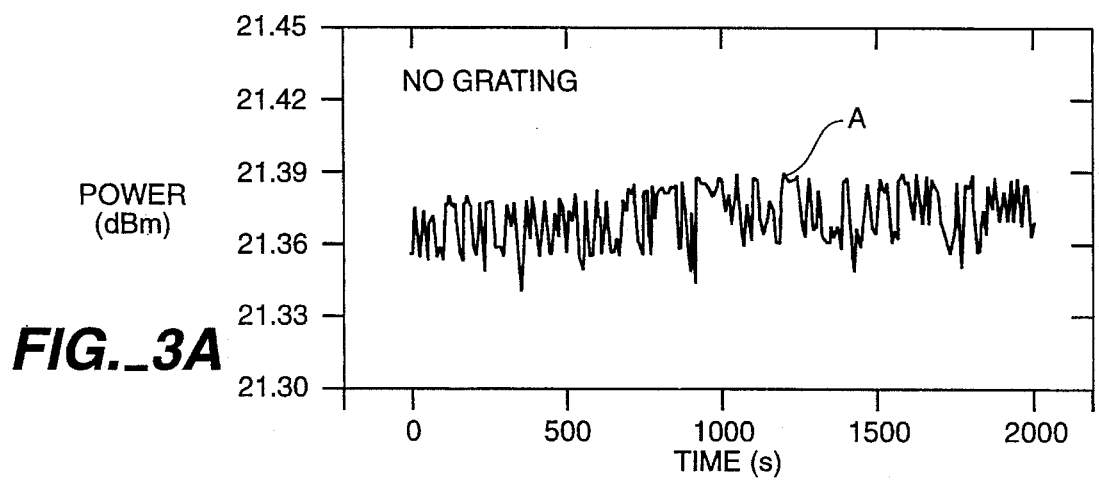
FIG._3A
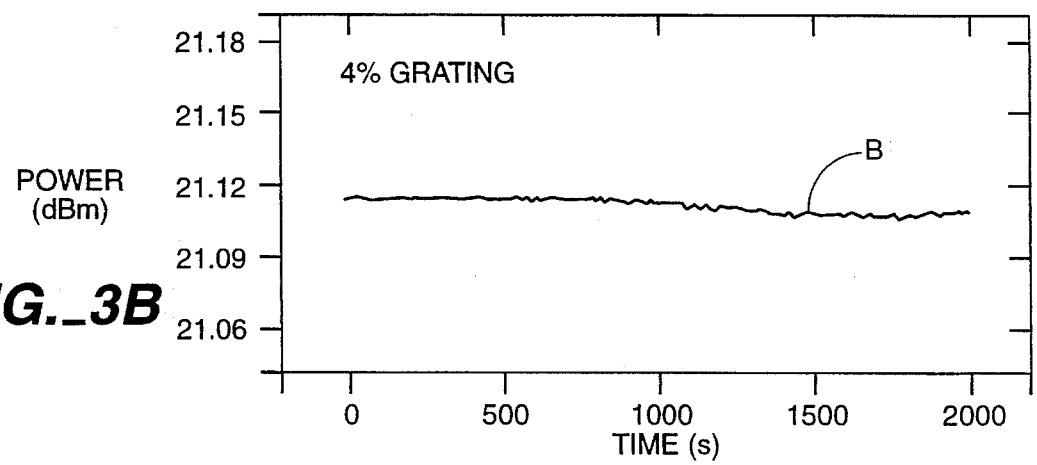
FIG._3B

MULTIPLE DIODE LASERS STABILIZED WITH A FIBER GRATING

RELATED APPLICATION

This is a continuation-in-part of U.S. patent application Ser. No. 267,785 filed Jun. 28, 1994 and entitled Fibre-Grating-Stabilized Diode Laser, in Group Art Unit 2501, now U.S. Pat. No. 5,485,481.

FIELD OF THE INVENTION

The present invention is a dual laser source which provides narrow-bandwidth, high-power optical radiation with stabilized wavelength and intensity that is suitable for optically pumping fiber amplifiers or fiber lasers.

BACKGROUND OF THE INVENTION

Optical fiber amplifiers and lasers have rapidly become important components of optical communications systems. Optical fiber amplifiers are used to intensify optical signals that are attenuated along a fiber-optical communications path. They have replaced cumbersome electrical repeaters in fiber-optic communication links allowing true all-fiber optical communications systems to be realized. Similarly, optical fiber lasers have been proposed to generate an optical carrier for fiber-optical communications systems. These lasers can be externally modulated to carry digital or analog information and in some cases are an alternative to diode lasers as sources of high-power light in fiber-optical communications systems.

Both fiber lasers and amplifiers operate on similar principles. The silica glass in the guided-wave region of the optical fiber is doped with traces of a rare-earth element such as erbium or praseodymium, which exist in the triply ionized state in a glass matrix. The energy structure of these ions is such that an optical signal of a particular wavelength propagating in the guided-mode region of the fiber can be amplified if the ions are pumped into an excited energy level by the addition of, for example, electromagnetic radiation of the appropriate energy. In the case of erbium, for example, pumping the ions with light of wavelength 980 nm or 1480 nm will configure the erbium ions to amplify signal light of approximately 1535–1565 nm. In the case of praseodymium, pumping the ions with light of wavelength 1017 nm will configure the praseodymium ions to amplify signal light at approximately 1300–1320 nm. This is the basis for optical fiber amplifiers. If a further mechanism is established to recirculate this amplified signal in the fiber by placing appropriate reflectors at the ends of the fiber, then laser action can occur if the net gain in the fiber equals the loss within some optical bandwidth. Most modern optical communications systems utilize laser sources at approximately 1300 nm or 1550 nm, so fiber amplifiers that operate at either of these wavelengths are of considerable importance.

The excitation or pumping of rare-earth doped optical fibers is currently accomplished most conveniently by light from semiconductor diode lasers that is directed into the end of the doped fiber by means of a focusing system such as one comprised of lenses. Current focusing systems couple between 40% to 90% of the light from the diode lasers into the fiber; commercially available systems typically having coupling efficiencies of 50% to 60% for diode lasers that emit in a single spatial mode. The guided mode region of the fiber is circular with a radius of 3–7 µm typically, which is sufficiently small to achieve high intensity over long interaction lengths with only modest optical powers of 50–100 mW. The light intensity required to allow significant amplification is quite high, typically 0.5–1.0 MW/cm$^2$ for erbium-doped fiber amplifiers and 2.0–5.0 MW/cm$^2$ for praseodymium-doped fiber amplifiers. With a coupling efficiency of 50%, this requires diode lasers with output power of 100–200 mW, and such lasers are commercially available. Further improvements in amplifier gain can be obtained by increasing the intensity of the pump light in the guided-mode region of the fiber. This can be achieved by reducing the radius of this region, but this increased the numerical aperture of the fiber which may have the effect of reducing coupling efficiency. Alternatively, increasing the output power of the diode laser will increase the intensity; however, the current art does not yet allow the fabrication of reliable single spatial mode diode lasers with output power greatly exceeding 200 mW that have sufficient operating lifetimes to be suitable for optical communications systems. In the case of praseodymium-doped fiber amplifiers, which require even more optical pumping power than erbium-doped fiber amplifiers, it is often essential in some amplifier configurations to couple power from more than one diode laser into the doped fiber. Consequently, combining the power from more than one diode laser is an attractive alternative for increasing the intensity of the optical pump power in doped fiber lasers and amplifiers.

It is known that means exist for combining the power from two optical sources with orthogonal polarizations. Devices fabricated with birefringent materials, such as a Wollaston prism, have been employed to physically separate an unpolarized or partially polarized light beam into separate beams of orthogonal polarization that propagate in different directions. Ideally, the sum of the optical power of the separated beams equals that of the incident beam provided there is no absorption of light in the beam splitting device. In its reverse configuration, however, such a device can be used to combine light from two polarized optical sources into a single beam of unpolarized light, thus combining the optical power. Devices that can perform such a function are numerous and are known to those skilled in the art. Such devices include those based on birefringent crystals, on dielectric coatings deposited on the interface between two glass prisms, and fiber optical devices that combine the light in two polarization-preserving fibers into a single fiber.

The characteristics of a rare-earth-doped fiber amplifier or laser is highly dependent on the characteristics of the pump laser. In particular, unwanted fluctuations or instabilities in the optical power or wavelength of the diode laser can cause corresponding fluctuations in the amplification of the signal in an amplifier or in the output power of a laser. Because the response time of the excited state of rare-earth elements in glass is approximately $3 \times 10^{-3}$s to $10^{-2}$s, pump laser instabilities on a shorter time scale are not manifested in the amplifier or laser operation. The most troublesome source of pump diode laser instabilities on this time scale is laser mode-hopping noise and wavelength and intensity fluctuations caused by unwanted optical feedback into the diode laser or changes in temperature or injection current. This noise is especially detrimental in rare-earth-doped fiber amplifiers because it increases errors in the amplified communications signal and detracts from the practicality of these devices.

Several techniques exist to reduce the effect of pump diode laser noise. One example is an active electrical system that detects the variation in output power of the fiber amplifier caused by a fluctuation in the diode laser characteristics and this signal is fed back into the pump laser at the correct phases to reduce the laser fluctuation. Unfortunately, this technique adds cost and complexity to the amplifier. For this reason, it is preferable to employ a passive method of reducing diode laser fluctuations. An attractive solution is to feed back into the pump diode laser a fraction of its own light. These lasers are very sensitive to optical feedback, and if such feedback is properly controlled, improved laser operation can result. Feedback is usually provided by an external reflector such as a mirror or diffraction grating, and external optical elements such as lenses are required to manipulate and guide the light out of and back into the diode laser cavity. Although the external optics and reflectors can often be quite compact, it is difficult and expensive to align such a system, and the mechanical and thermal stability can often be inadequate for use in fiber amplifiers and lasers.

It should now be appreciated that a method to couple more optical pump power into rare-earth doped fiber amplifiers from semiconductor diode lasers is desirable. It is also necessary to provide a simple, convenient and mechanically rugged means for reducing the wavelength and intensity instabilities of the pump diode lasers.

SUMMARY OF THE INVENTION

The present invention is a dual laser source that combines, using a polarizing beam combiner device, the output light of two semiconductor diode lasers that emit linearly polarized electric fields of substantially similar wavelength. The optical power of the combined light is ideally a sum of the optical power emitted from each polarized optical source. The combined light from the two lasers is directed into an optical fiber which contains a fiber Bragg grating that serves to reflect a fraction of the output power back into the cavity of the diode lasers. A fiber Bragg grating is a periodic structure of refractive index variations in or near the guided-mode region of the optical fiber that can reflect light of a certain wavelength propagating along the fiber. The reflected light propagates in the guided-mode region of the optical fiber in a direction opposite to that of the incident light. The effect of the reflected light on the diode lasers depends on the magnitude of the fiber Bragg grating reflectivity, the optical bandwidth of the reflectivity, the wavelength of the fiber Bragg grating resonance compared to the wavelength of the maximum gain of the laser, and the magnitude of the diode laser injection current. For the appropriate diode laser and fiber Bragg grating parameters, a single fiber Bragg grating can stabilize the wavelength and intensity of both diode lasers.

The apparatus according to the present invention is formed by two semiconductor diode lasers, a means for delivering collimated polarized light from the diode lasers to a polarizing beam combiner which sums the optical power into a single beam of light, a means of delivering the combined light into a length of optical fiber, and a fiber Bragg grating formed in or near the guided wave region of the optical fiber.

In one of its aspects, the invention consists of an apparatus for generating a dual laser source having a narrow optical bandwidth and stabilized wavelength and intensity. The apparatus comprises means to deliver collimated, linearly orthogonally polarized, single spatial mode optical radiation from two semiconductor diode lasers of similar wavelength into a polarizing beam combiner device which combines the radiation into a single collimated beam. The beam is directed into optical fiber that is capable of guiding at least one mode of the diode lasers in a region of the fiber. A narrow-bandwidth reflector is formed in the guided mode region of the optical fiber, and the light reflected from the grating acts to stabilize both diode lasers simultaneously.

In another of its aspects the invention is an apparatus for generating a stable source of optical radiation comprising two mutually incoherent diode lasers that emit linearly polarized light substantially in a single spatial mode and that include a diode laser cavity including an output facet having substantially broadband reflectivity capable of generating multiple longitudinal modes within the laser cavity in the absence of external optical feedback at substantially low threshold. Means are provided for presenting the emission of the diode lasers such that the polarization of the diode lasers are orthogonal to each other. A polarizing beam combiner is used to combine two beams of light of substantially orthogonal polarizations into a single, substantially unpolarized beam of light, while summing the optical power of the mutually incoherent light beam. Means are provided for directing the orthogonally polarized emission of each diode laser into the polarizing beam combiner while maintaining the polarization state of each diode laser such that the light beams from each laser exiting the beam combiner are substantially overlapped and co-propagating. An optical fiber is provided which includes a guided-wave region that is capable of sustaining at least one mode of wavelength of the diode laser. Means are provided for directing the combined light of the diode lasers into the guided-mode region of the optical fiber, and a narrow-bandwidth reflector is formed in the guided mode region of the optical fiber.

BRIEF DESCRIPTION OF THE DRAWINGS

The preferred embodiment of the invention will be described by reference to the drawings thereof wherein:

FIG. 1 is a schematic representation of a stabilized dual laser source according to the present invention;

FIG. 2A–2C are graphs comparing the output spectrum of two diode lasers with and without a fiber Bragg grating in the optical fiber into which the optical radiation from both diode lasers is focused;

FIG. 2A is the spectrum of two diode lasers of slightly different centre wavelengths that are stabilized by a fiber grating according to the invention;

FIGS. 2B and 2C are the spectra of the two diode lasers operating without optical feedback from a fiber grating;

FIG. 3A and 3B are graphs comparing the time dependence of the intensity of two diode lasers with and without a fiber Bragg grating in the optical fiber into which the optical radiation from both diode lasers are focused.

DETAILED DESCRIPTION OF THE PREFERRED EMBODIMENT

FIG. 1 illustrates the stabilized dual laser source in accordance with the preferred embodiment of the invention. Two diode lasers 11 and 12 emit diverging optical radiation in a single spatial mode. The lasers are typically fabricated with a quantum-well epitaxial structure or index-guided structure from AlGaAs, InGaAs or InP semiconductor and are typically pumped by current injection. The lasers are configured with the appropriate dielectric coatings to emit radiation primarily from the front facet. Semiconductor diode lasers with the necessary characteristics are commercially available.

The divergent emission 13 and 14 from each laser is collimated with a delivery system 15 and 16. In the preferred embodiment, this system consists of a lens with the appropriate characteristics to collimate the laser output. However, the delivery system could also be a lens that directs a substantial fraction of the light into polarization preserving fiber such as Panda™ fiber from Fujikura Ltd., followed by a lens to collimate the output of the fiber. Alternatively, the first lens in the latter embodiment could be replaced by placing the optical fiber in proximity to the diode laser so as to collect a significant fraction of the diode laser output. In all cases, it is essential for the polarization of the electric field of the output 17 and 18 of each diode laser to be mutually orthogonal upon incidence into the polarizing beamsplitter or beam combiner apparatus, labelled 19. The elements of FIG. 1 were mounted on an optical table. Mechanical positioners were used for each of the diode lasers, the collimating lenses, the focusing lenses and the optical fiber. The position of the beam combiner 19 is fixed in the optical path while the positions of the other elements are adjusted using the positioners to achieve the required orthogonality.

In the preferred embodiment of the invention, the beam combiner apparatus 19 consists of two right angle dielectric prisms epoxied together hypotenuse-to-hypotenuse. Dielectric coatings such as $HfO_2$ or $TiO_2$ are deposited between the prisms on the hypotenuse. The coatings are such that light of one polarization, such as 17, is completely transmitted through the cube, as shown in FIG. 1 while light of an orthogonal polarization is nearly completely specularly reflected. If the angles of the cube are 45°, as shown, and if the incident light 17 and 18 propagate in the same plane and in a direction that is mutually orthogonal, then the two beams exiting the beam combiner will be colinear. The optical power of the two beams will be summed linearly such that if the power of the laser 11 is $P_1$ and the power of laser 12 is $P_2$, then the power in the beam 20 exiting the beamsplitter will be $P_1+P_2$, provided there is no absorption or scattering of light in the optical path.

Although the preferred embodiment includes a dielectric beam combiner as described, those skilled in the art will appreciate that there are a variety of optical devices that act to combine light of two orthogonal polarizations into one beam with the effect of summing the power in the beam. Beam combiner devices can be fabricated in polarization-maintaining optical fiber and have the same effect as the bulk-optic combiner described above. Essentially, the device is composed of two polarization-maintaining fibers in which polarized light from a laser propagates. A section of each fiber is polished down to within a few microns of the light-guiding region and these regions are brought into proximity to each other. In this circumstance, it is possible for the light from each fiber to couple into the other fiber and back again along the length of the interacting region. The length of this region can be chosen so that all the light is in one fiber, effectively combining the light (and power) from two fibers into one. These devices are known and are commercially available, such as, for example, the PB-100 series device from JDS Fitel. The use of such devices is included in the scope of the present invention.

The collimated beams 20 exiting the beam combiner are collected with a focusing system 21 and directed in a length of optical fiber 23 containing a fiber Bragg grating 24 which is 70 cm from the input of the fiber in the preferred embodiment. The optical fiber is typically fabricated from silica glass containing trace dopants to improve the light guiding characteristics of the fiber. Such dopants include germanium, phosporus, and aluminum. The fiber refractive indices and core size are such that the light from the diode lasers can be guided along a region of the fiber with minimal loss. The preferred embodiment of the invention incorporates optical fiber that sustains only the lowest order guided mode; this requires the fiber to have a V-number of less than approximately 2.405, where V is defined by $$V = \frac{2\pi a}{\lambda} \sqrt{n_1^2 - n_2^2}$$

where a is the radius of the core, $\lambda$ is the wavelength of the light, $n_1$ is the refractive index of the core and $n_2$ is the refractive index of the cladding.

The fiber 23 can be fabricated to have a small birefringence and hence to not strongly maintain the state of polarization of the light in the fiber. The polarization states will thus be altered by imperfections in the glass or by birefringence that is induced by bending stress. This may in some circumstances cause an uncontrolled amount of feedback from the fiber Bragg grating into each of the two diode lasers, since the feedback must traverse the polarizing beamsplitter on its return into the diode laser cavities. As a result, the preferred embodiment of the invention uses fiber with a constant longitudinal birefringence induced upon fabrication that maintains the state of polarization of light that is launched into the fiber such as Panda™ fiber from Fujikura Ltd.

The fiber Bragg grating 24 acts to reflect a portion of the light from each diode laser back into each laser cavity provided the wavelength of maximum reflection from the grating is within the gain bandwidth of the diode lasers. The remainder of the light 25 passes through the grating and exits the fiber. The grating can be etched near the guided-mode region of the fiber using lithography techniques, or more conveniently, can be created by exposing the guided-mode region to a pattern of periodic intensity variation of high-fluence ultraviolet light incident upon the fiber from the side. If the latter techniques is used, it is convenient if the guided-mode region of the fiber contains a concentration of germanium to render the fiber photosensitive to the incident ultraviolet light.

In the preferred embodiment of the invention, the fiber grating is selected to have a maximum reflectivity within 10 nm of the free-running diode laser emission wavelength, and the reflectivity of the grating is similar to that of the exit facet of the diode laser. The full-width-at-half-maximum bandwidth of the grating reflectivity is typically 0.05 nm to 2.0 nm. The optical separation of the diode lasers 11 and 12 and the fiber grating 24 may be a few hundred micrometers to several kilometers but is most conveniently one meter, approximately.

The effect of the fiber grating on the spectral characteristics of a diode laser is explained by considering the wavelength-dependent loss in the coupled cavity formed by the fiber grating and the diode laser facet. Those skilled in the art will appreciate that the optical feedback from the fiber grating effectively reduces the loss of light from the laser cavity of light within the bandwidth of the fiber grating. The laser will operate at the wavelength of lowest loss, hence the wavelength of the diode laser can be shifted from its free-running value to that of the fiber grating. This effect occurs to an extent that varies with the wavelength separation between the fiber grating and the gain peak of the diode laser, and on the magnitude of the reflectivity of the fiber grating. The effective reflectivity $R_{eff}$ of the fiber grating is given by $$R_{eff} = \eta^2 R_g$$

where $\eta$ is the coupling efficiency of the diode laser to the fiber and $R_g$ is the reflectivity of the fiber grating.

The spectrum of the diode lasers under conditions of optical feedback from the fiber grating is affected by the feedback of the diode laser cavity itself, which is formed by the cleaved ends of the semiconductor chip. In the preferred embodiment of the invention, the reflectivity of the fiber grating is selected such that the broad-band feedback from the diode laser facet is greater than or approximately equal to the feedback from the fiber grating. In this case, the feedback from the fiber grating acts as a perturbation of the coherent electric field formed in the laser cavity. The perturbation breaks the coherence of the diode laser emission thus broadening the spectral output of the diode laser by several orders of magnitude and resulting in the excitation of several external cavity modes of the coupled cavity system. This is termed coherence collapse of the diode lasers. These modes oscillate at frequencies that are multiples of the round-trip frequency of the coupled cavity but lie within the bandwidth of the fiber grating. The diode laser is thus constrained to operate within the fiber grating bandwidth and large fluctuations in the wavelength and intensity of the diode laser are avoided.

In a free-running diode laser, lower-frequency (<1MHz) intensity fluctuations are caused by the transition between longitudinal modes of the diode laser cavity. Such transitions are caused by extraneous optical feedback or current and temperature fluctuations of the laser. The noise caused by these transitions is detrimental to the operation of fiber lasers and amplifiers; it is greatest when there is a transition between one single laser mode and another single laser mode. Since the presence of the fiber grating induces the simultaneous lasing of multiple (external-cavity) longitudinal modes, the noise caused by mode transitions is correspondingly reduced.

The lasers are not perturbed by extraneous optical feedback from reflective components located beyond the fiber grating provided the magnitude of the extraneous feedback is less than that provided by the fiber grating.

Multiple-longitudinal-mode operation described above requires that the optical separation between the diode lasers and the fiber grating must be much longer than that of the coherence length of the diode lasers. If the separation is less than the coherence length, the feedback will become coherent with the output of the diode lasers and very narrow, single longitudinal mode operation near the fiber grating wavelength will result; such a situation may again lead to intensity noise if mode transitions occur.

In the preferred embodiment of the invention, the two strained-layer InGaAs multi-quantum well semiconductor diode lasers 11 and 12 are the SDL6500 laser from Spectra Diode Labs, and the beams emitted from the lasers are collimated with aspheric lens systems 15 and 16, namely the Corning Precision Molded Optics 350150. Each laser typically emits optical radiation at 960–1160 nm. The lasers emit linearly polarized light and are mechanically oriented by positioners so that the light from the lasers entering the beamsplitter is mutually orthogonally polarized. The lasers and lenses are aligned in such a way that the collimated light from each laser passes through the polarizing beam combiner 19 and exits the device colinearly so as to overlap and be co-propagating as at 20. In this way, the beam of light exiting the beamsplitter has optical power that is a sum of the two individual light beams. The combined beam is collected and focused with an aspheric lens 21 (Corning Precision Molded Optics model 350170) into an optical fiber 23 containing a fiber Bragg grating 24 with an efficiency of at least 0.5. The reflectivity of the grating under these conditions should be 0.02 to 0.06 to ensure that both lasers are stabilized at the grating wavelength while allowing the majority of the laser light to pass beyond the grating into the remainder of the optical fiber. The optimum grating reflectivity is dictated by the coupling efficiency. The wavelength of each laser need not be identical but should typically lie with 10 nm of the wavelength of the maximum reflectivity of the fiber grating. The grating is typically 1 to 2 mm in length and has a bandwidth of 0.2 nm to 0.5 nm. To ensure that a state of coherence collapse is maintained in the two lasers, it is desirable to maintain an optical separation between the fiber grating and the lasers of at least 0.5 meters.

Assuming the fiber is lossless, and assuming the laser sources are substantially mutually incoherent, the output power Pout from the end of the fiber is given by $$P_{out} = (\eta_1 P_1 + \eta_2 P_2)(1 - R_g)$$

where $P_1$ and $P_2$ are the output powers from the facets of each of the two lasers, $\eta_1$ and $\eta_2$ are the coupling efficiencies of each lasers through the lenses and beam combiner and into the fiber containing the grating, and $1-R_g$ is the transmission of the grating. If lasers of similar power are used and similar coupling efficiencies are obtained, this equation demonstrates that it is possible to obtain twice as much power from the fiber as would be obtained with a single diode laser. For example, with commercially available lasers that emit 150 mW and with coupling efficiencies of 0.6 for each laser, 171 mW of stabilized laser light can be obtained through a grating with a reflectivity of 0.05.

FIG. 2A, 2B and 2C illustrate the optical spectrum of the present invention. Curves B and C of FIGS. 2B and 2C are the spectra of each individual laser without stabilization by a fiber Bragg grating. The destabilization of the laser is caused by a small mount of broadband optical feedback into the laser cavities. Curve A of FIG. 2A is the spectrum of the combined laser source stabilized by a fiber grating with a similar amount of broadband feedback into the laser cavities.

FIG. 3A and 3B illustrate the reduction in intensity fluctuation provided by the present invention. Curve A in FIG. 3A is the combined intensity of the diode lasers without stabilization by a fiber Bragg grating. The obvious fluctuations in power are caused by laser mode transitions, as described previously. Curve B in FIG. 3B illustrates the reduction in intensity noise as a result of the stabilization of the lasers with a fiber Bragg grating.

It should be evident that the present invention provides a stabilized dual laser source of high-power optical radiation that is suitable for pumping optical fiber amplifiers and lasers such as fiber lasers. The invention will enable improvement in the operating characteristics of these devices. It will be appreciated by those skilled in the art that although the preferred embodiment of the invention has been described in detail for the purpose of clarity, certain changes or modifications may be practised without departing from the scope of the invention.

We claim:

1. Apparatus for generating a stable source of optical radiation comprising:
    two mutually incoherent diode lasers that emit linearly polarized light beams substantially in a single spatial mode and that include a diode laser cavity including an output facet having substantially broadband reflectivity capable of generating multiple longitudinal modes within the laser cavity in the absence of external optical feedbacks, said beams comprising mutually incoherent beams of substantially orthogonal polarizations;

a polarizing beam combiner to receive said beams of substantially orthogonal polarizations and combine them into a single, substantially unpolarized beam of light, while adding the optical power of said beams;

first means for directing the orthogonally polarized emission of each diode laser into the polarizing beam combiner while maintaining the polarization state of each diode laser such that the light beams from each laser exiting the beam combiner are substantially overlapped and co-propagating;

an optical fiber which includes a guided-wave region that is capable of sustaining at lease one mode of wavelength of the diode laser;

second means for directing the combined light of the diode lasers into the guided-mode region of the optical fiber;

a narrow-bandwidth reflector formed in the guided mode region of the optical fiber.

2. Apparatus according to claim 1 wherein said second means for directing comprises focusing means.

3. Apparatus according to claim 2 wherein said focusing means comprises at least one lens means.

4. Apparatus according to claim 1 wherein said first means for directing comprises an optical fiber positioned in close proximity to an exit facet of at least one of the diode lasers such that a substantial portion of the light beams emitted from the at least one diode laser is collected by the fiber.

5. Apparatus according to claim 1 wherein said first means for directing comprises focusing means for directing the light beams into an optical fiber that maintains the state of polarization of the light, said second means for directing comprises collimating means.

6. Apparatus according to claim 1 wherein said polarizing beam combiner comprises two right-angle prisms between which is deposited a series of layers of dielectric material that reflects light of one polarization while transmitting light of an orthogonal polarization.

7. Apparatus according to claim 1 wherein said polarizing beam combiner comprises two polarization maintaining optical fibers in close proximity of one another.

8. Apparatus according to claim 1 wherein said narrow-bandwidth reflector has a spectral distribution of full-width at half maximum of 0.05 nm to 2.0 nm.

9. Apparatus according to claim 1 wherein said narrow-bandwidth reflector has an effective reflectivity $R_{eff}$ defined as $$R_{eff} = O^2 R_g$$

where $R_g$ is the maximum reflectivity of the narrow-bandwidth reflector and O is the coupling efficiency of the light beam from the diode laser to said narrow-bandwidth reflector and said effective reflectivity is less or approximately equal to that of the exit facet of the diode laser.

10. An apparatus according to claims 1, 2, 3, 4, 5, 6, 7, 8 or 9 wherein said narrow-bandwidth reflector is a fiber Bragg grating.

11. An apparatus according to claim 10 wherein said fiber Bragg grating is formed by exposure to ultraviolet light in the guided-wave region of the optical fiber.

12. An apparatus according to claim 1 wherein said optical fiber is capable of substantially maintaining the state of polarization of the light beam propagating in the guidewave region of the fiber.

13. Apparatus according to claim 1 wherein each of said linearly polarized light beams has a wavelength of 960 nm to 1160 nm.

14. Apparatus according to claim 1 wherein said linearly polarized light beams are mutually substantially incoherent.

15. Apparatus according to claim 1 wherein the optical separation between each of said diode lasers and said narrow-bandwidth reflector is substantially greater than the coherence length of the diode lasers under the influence of optical feedback from the narrow-bandwidth reflector.

16. Apparatus for stabilizing multiple laser sources comprising:

a plurality of laser sources having respective lasing cavities and light beam outputs at their respective laser facets, said outputs emitting linearly polarized fields of substantially similar wavelength, said laser facets also providing a level of partial reflectivity for a portion of said light beam outputs in said laser cavities for optical feedback therein, said light beam outputs having wavelength bands dependent upon the instantaneous operating characteristics of said laser sources;

means to combine said linearly polarized outputs into a single output beam;

an optical fiber having an input end coupled to receive said single output beam from said combining means;

a grating formed in said optical fiber, said grating having a reflectivity band for reflecting selected wavelengths back into both of said laser cavities;

said optical fiber grating having a reflectivity level approximately equal to or less than the reflectivity level of said laser source facets.

17. The apparatus of claim 16 wherein said linearly polarized beam outputs of said laser sources are oriented to be orthogonal to one another; said combining means includes a polarizing beam combiner to receive said beam outputs and to combine them into a single substantially unpolarized light beam having an optical power representing the addition of the optical power of each of said beams.

18. The apparatus of claim 16 wherein said fiber grating is sufficiently spaced from said laser sources to produce multiple longitudinal mode operation of said laser sources.

19. The apparatus of claim 16 wherein said laser sources contains a strained layer InGaAs quantum well.

20. The apparatus of claim 16 wherein said fiber input end coupling includes a lens.

21. The apparatus of claim 16 wherein said combining means includes an optical fiber positioned in close proximity to each of said laser source facets to receive their respective beam outputs.

22. The apparatus of claim 16 wherein said grating has a maximum reflectivity within 10 nm of the emission wavelength of said laser sources absent said grating.

23. The apparatus of claim 16 wherein the reflection bandwidth of said grating is between about 0.05 nm and 2 nm.

24. The apparatus of claim 16 wherein the wavelength of maximum reflectivity of said grating wavelength band is within the gain bandwidth of said laser sources.

25. The apparatus of claim 16 wherein said combining means comprises a polarizing beam combiner.

26. The apparatus of claim 16 wherein the spacing between said grating and said fiber input end is greater than the coherence length of said light beam outputs.

27. The apparatus of claim 16 wherein said fiber grating has a narrow band of wavelengths which at least partially overlaps the wavelength emission bands of said laser sources absent the presence of said grating;

said grating having a peak reflectivity within 10 nm of the wavelength emission bands of said laser sources.

28. The apparatus of claim 16 further comprising a solid state gain medium and an output of said optical fiber coupled into said medium.

29. The apparatus of claim 28 wherein said medium comprises a fiber amplifier.

30. The apparatus of claim 28 wherein said medium comprises a fiber laser.

* * * * *